United States Patent
Paul et al.

(10) Patent No.: US 9,846,212 B2
(45) Date of Patent: Dec. 19, 2017

(54) METHOD AND APPARATUS FOR MAGNETIC RESONANCE IMAGING

(71) Applicant: Siemens Aktiengesellschaft, Munich (DE)

(72) Inventors: Dominik Paul, Bubenreuth (DE); Benjamin Schmitt, Naremburn (AU)

(73) Assignee: Siemens Aktiengesellschaft, Munich (DE)

( * ) Notice: Subject to any disclaimer, the term of this patent is extended or adjusted under 35 U.S.C. 154(b) by 534 days.

(21) Appl. No.: 14/596,484

(22) Filed: Jan. 14, 2015

(65) Prior Publication Data

US 2015/0198686 A1    Jul. 16, 2015

(30) Foreign Application Priority Data

Jan. 15, 2014    (DE) .................. 10 2014 200 562

(51) Int. Cl.
*G01R 33/54*   (2006.01)
*G01R 33/48*   (2006.01)
*G01R 33/56*   (2006.01)
*G01R 33/483*  (2006.01)

(52) U.S. Cl.
CPC ......... *G01R 33/54* (2013.01); *G01R 33/4818* (2013.01); *G01R 33/4835* (2013.01); *G01R 33/5607* (2013.01); *G01R 33/5602* (2013.01)

(58) Field of Classification Search
CPC G01R 33/4818; G01R 33/4835; G01R 33/54; G01R 33/5602; G01R 33/5607
See application file for complete search history.

(56) References Cited

U.S. PATENT DOCUMENTS

| | | | | |
|---|---|---|---|---|
| 7,941,204 | B1 * | 5/2011 | Wang | G01R 33/4824 324/307 |
| 8,508,223 | B2 * | 8/2013 | Kitane | A61B 5/0263 324/307 |
| 2009/0273343 | A1 | 11/2009 | Borthakur et al. | |
| 2014/0039297 | A1 | 2/2014 | Keupp | |

* cited by examiner

*Primary Examiner* — Gregory H Curran
(74) *Attorney, Agent, or Firm* — Schiff Hardin LLP

(57) ABSTRACT

In a method and apparatus for magnetic resonance imaging, in order to improve saturation of magnetic resonance signals during an acquisition sequence, the acquisition sequence includes at least one acquisition cycle, that includes: a preparation pulse set with a number of preparation pulses, a saturation pulse set that is disjoint from the preparation pulse set, with a number of saturation pulses, and a readout block set with a number of readout blocks. The acquisition cycle is temporally divided into a preparation phase and a readout phase, wherein the readout phase is temporally delimited from the preparation phase, and the readout phase follows the preparation phase in the acquisition cycle, and wherein the preparation phase includes at least one preparation pulse of the preparation pulse set, at least one saturation pulse of the saturation pulse set and no readout block of the readout block set, and the readout phase includes at least one saturation pulse of the saturation pulse set and at least one readout block of the readout block set.

7 Claims, 2 Drawing Sheets

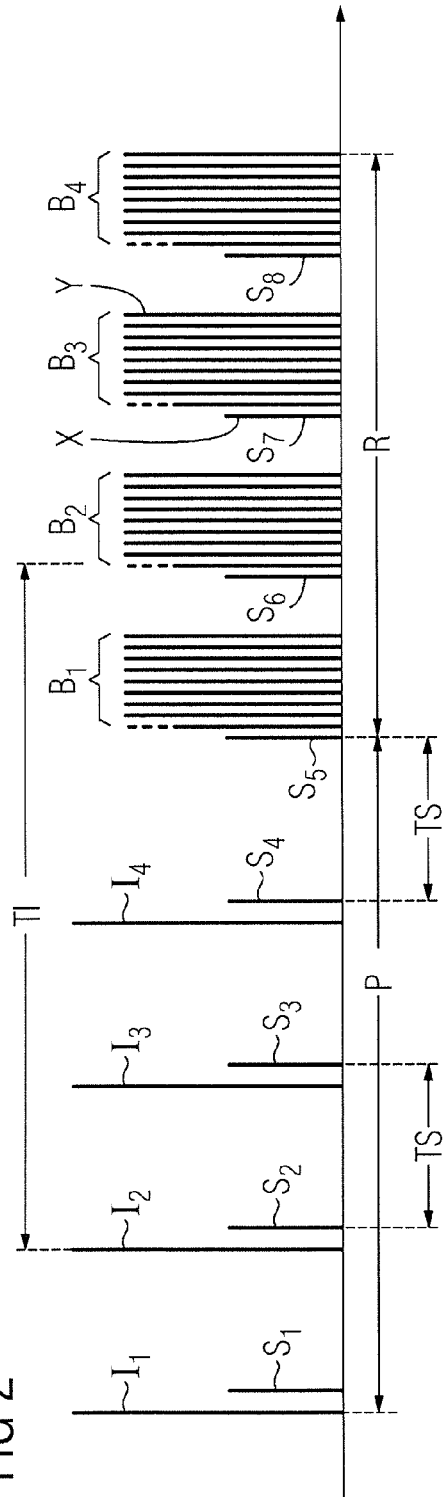
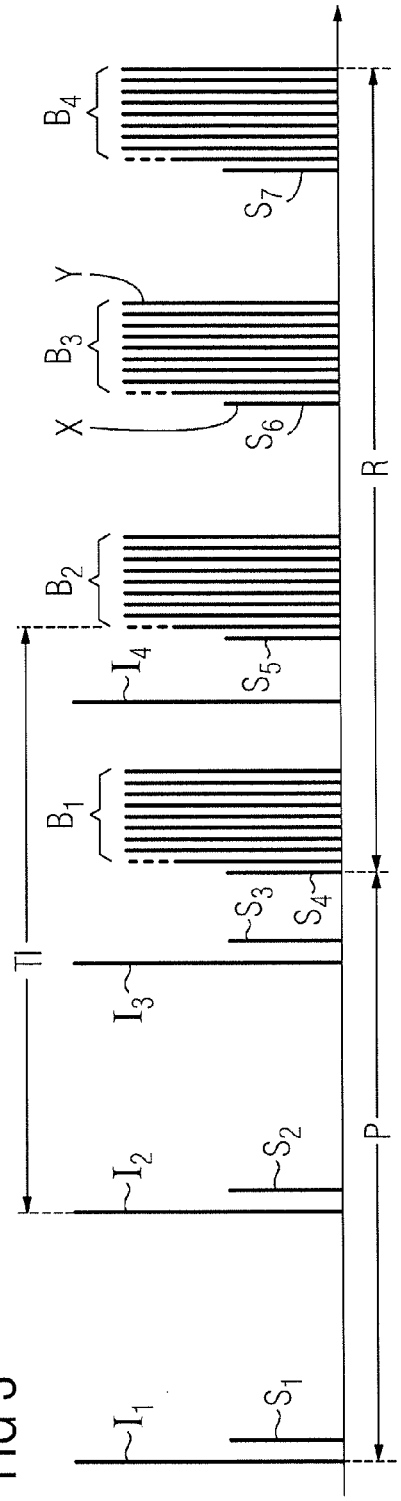
FIG 2
FIG 3

METHOD AND APPARATUS FOR MAGNETIC RESONANCE IMAGING

BACKGROUND OF THE INVENTION

Field of the Invention

The invention concerns a method for magnetic resonance imaging, as well as a magnetic resonance apparatus, and a non-transitory, computer-readable data storage medium encoded with programming instructions that cause such a method to be implemented.

Description of the Prior Art

In magnetic resonance imaging, the acquisition of magnetic resonance image data of an examination subject is implemented by a magnetic resonance apparatus operated by acquisition sequences (magnetic resonance sequences). Acquisition sequences often provide a saturation of magnetic resonance signals of specific tissue types. The saturation typically produces a suppression of the magnetic resonance signals emanating from the specific tissue types. For example, many acquisition sequences provide a fat saturation, which can be used to improve contrast between fat tissue and other tissue types. Alternatively, a fat saturation can be used to emphasize fat tissue. The saturation of the magnetization is thereby often used in combination with a preparation of the magnetization, for example by inversion pulses. For example, this combination of saturation and preparation of the magnetization is advantageously usable for imaging of the spinal column of an examination subject.

SUMMARY OF THE INVENTION

An object of the invention is to enable improved saturation of magnetic resonance signals during an acquisition sequence.

This object is achieved in accordance with the invention by a method for magnetic resonance imaging of an examination subject using an acquisition sequence that includes at least one acquisition cycle, wherein the acquisition cycle includes a preparation pulse set that has a number of preparation pulses, a saturation pulse set that is disjoint from the preparation pulse set, and that has a number of saturation pulses, and a readout block set that has a number of readout blocks. The acquisition cycle is temporally divided into a preparation phase and a readout phase, wherein the readout phase is temporally delimited from the preparation phase and the readout phase follows the preparation phase in the acquisition cycle. The preparation phase includes at least one preparation pulse of the preparation pulse set, at least one saturation pulse of the saturation pulse set and no readout block of the readout block set, and the readout phase includes at least one saturation pulse of the saturation pulse set and at least one readout block of the readout block set.

The examination subject can be a patient, a training volunteer or a phantom. An acquisition sequence is typically a pulse sequence. The acquisition sequence is typically used by a magnetic resonance apparatus. An acquisition cycle can include a sequence of excitation pulses and readout steps which is repeated cyclically within the acquisition sequence. An acquisition cycle of the acquisition sequence can start with a relaxed magnetization, for example a relaxed longitudinal magnetization. An acquisition cycle can be implemented during a breath-hold procedure of the examination subject. One or more slices of a magnetic resonance image can be acquired in an acquisition cycle. One or more k-space lines of a magnetic resonance image can be acquired in an acquisition cycle. An acquisition sequence can be implemented during a repetition time of the acquisition sequence. In the acquisition sequence, the acquisition cycles can be repeated until all predetermined k-space lines and/or all predetermined slices of the magnetic resonance image are acquired.

A preparation pulse typically leads to a preparation, in particular a deflection, of the nuclear spins in an examination region of the examination subject. A preparation pulse thus prepares the magnetization (for example the longitudinal magnetization) that exists in the examination region. A preparation pulse can be an inversion pulse. An inversion pulse typically rotates the magnetization by at least 150° and at most 210°, in particular by 180°. The inversion pulse can be adiabatic and then have a target flip angle of 180°. The inversion pulse can thus produce a reversal of the magnetization (in particular the longitudinal magnetization) from positive to negative values. The number of preparation pulses of the preparation pulse sequence is greater than zero.

A saturation pulse can have the effect that a value of a magnetization (for example the longitudinal magnetization) is largely set to zero. A saturation pulse is thereby typically tissue-specific, meaning that a saturation pulse largely sets only the magnetization of a specific tissue type to zero. Saturation pulses can thus select the type of tissue from which magnetic resonance signals can be acquired. Saturation pulses can be fat saturation pulses, i.e. can set the magnetization (in particular the longitudinal magnetization) of adipose tissue to zero (saturate it). After application of a saturation pulse, only a transversal magnetization typically still exists, in particular for the specific tissue type. For this a saturation pulse can include a spoiler gradient to dephase the magnetization. A saturation pulse thus typically erases any history in the magnetization (in particular the longitudinal magnetization) since the saturation pulse typically sets the magnetization to zero without taking into account the preceding values of the magnetization. The number of saturation pulses of the saturation pulse set is greater than zero.

A readout block typically includes a readout window which includes the activation of a reception device for the magnetic resonance signals—for example of an ADC (analog/digital converter)—that is coupled to the reception coils of the magnetic resonance apparatus. A readout block furthermore typically includes an excitation pulse to excite the magnetization in the measurement volume. An excitation pulse thereby typically ensures that a magnetic resonance signal can be read out from an examination region. Furthermore, a readout block typically includes at least one refocusing pulse to refocus the magnetization in the measurement volume. The excitation pulse thereby typically occurs at the start of the readout block. The refocusing pulses and readout windows then typically take place in alternation after an excitation of the magnetization has taken place by means of the excitation pulse. A readout block can include an entire echo train within the scope of a turbo spin echo acquisition. During a readout block, one or more k-space lines of a slice a magnetic resonance image are typically acquired. The number of readout blocks of the readout block set is greater than zero. A readout block typically includes no preparation pulse and no saturation pulse.

According to the invention, only a preparation and saturation of the magnetization occur in the preparation phase by the activation of at least one preparation pulse of the preparation pulse sequence and at least one saturation pulse of the saturation pulse set. According to the invention, no readout of magnetic resonance signals, by the readout blocks of the readout block set, occurs in the preparation phase.

According to the invention, a readout of magnetic resonance signals occurs in the readout phase by activation at least one readout block of the readout block set. Furthermore, according to the invention at least one saturation pulse of the saturation pulse set occurs during the readout phase.

The number of preparation pulses in the acquisition cycle is preferably equal to the number of readout blocks. In particular, a preparation pulse is then associated with each readout block. The preparation pulse then generates a preparation of the magnetization which is then excited in the associated readout block. The time between preparation of the magnetization by a preparation pulse and excitation of the magnetization by the excitation pulse of the readout block belonging to that preparation pulse is typically called a preparation time. Possible preparation times are in the time range from 100 ms to 3000 ms, in particular in the time range from 800 to 1200 ms. If the preparation pulse is an inversion pulse, the preparation time is also called an inversion time. It is therefore advantageous that preparation pulses and the associated readout blocks have a defined time spacing. If k-space lines for a specific slice of the magnetic resonance image are acquired in each readout block, the preparation pulse belonging to the readout block can take place slice-selectively for the specific slice.

For example, if multiple slices of the magnetic resonance image are acquired in an acquisition cycle, preparation pulses of the preparation pulse set can also occur during the readout phase of the acquisition cycle. The preparation pulses are then temporally alternating and/or interleaved with the readout blocks of the readout phase. A time-interleaved preparation of the magnetization and readout of the magnetic resonance signals thus occurs. Such an acquisition sequence—in particular with inversion pulses as preparation pulses—is also called an interleaved inversion recovery (IIR) acquisition sequence. The acquisition sequence according to the invention can be an interleaved inversion recovery acquisition sequence.

In the readout phase, a saturation pulse occurs immediately before each readout block, in particular immediately before each excitation pulse of the readout block. "Immediately" as used herein means that no additional radio-frequency pulse is switched between the saturation pulse and the excitation pulse. The saturation pulse then advantageously leads to a suppression of signals of a certain tissue type upon readout of the magnetic resonance signals in a readout block following the saturation pulse. For example, a fat saturation pulse leads to the saturation and/or suppression of fat signals, i.e. to a saturation and/or suppression of the magnetic resonance signals that are received from adipose tissue. Therefore, the saturation pulse of the saturation pulse set which immediately precedes the chronologically first readout block of the readout block set in the acquisition cycle typically represents the beginning of the readout phase. In the readout phase, the number of readout blocks is thus typically equal to the number of saturation pulses.

Due to the fact that the saturation pulses are frequency-selective (and therefore slice-selective), the exclusive application of a respective saturation pulse for each readout block in the readout phase would lead to an inhomogeneous suppression of the tissue signals for different slices of a magnetic resonance image. Some slices of the magnetic resonance image would then possibly have a sufficient saturation of the tissue signal (in particular of the fat signal given a fat saturation), while other slices of the magnetic resonance image would have an insufficient saturation of the tissue signal and thus an increase of the tissue signal. A variation of the tissue signal (in particular of the fat signal given a fat saturation) would thus occur along a slice direction of the magnetic resonance image.

Therefore, according to the invention at least one saturation pulse occurs in the preparation phase. A continuous saturation of the magnetization by means of saturation pulses thus advantageously takes place over the entire acquisition cycle. Saturation (in particular continuous saturation) of the magnetization by the saturation pulses already occurs during the preparation of the magnetization in the preparation phase. The continuous saturation of the magnetization by the continuous application of saturation pulses over the entire acquisition cycle leads to a homogeneous saturation and/or suppression of a tissue signal (in particular of a fat signal given a fat saturation) across all slices of the magnetic resonance images acquired by the acquisition sequence. The image quality of the magnetic resonance images acquired by the acquisition sequence is thus increased, for example since lesions in the magnetic resonance images can be more clearly differentiated from adipose tissue. The acquisition sequence thus offers an advantageous and homogeneous suppression of tissue signals, for example of fat signals. The saturation of the tissue signals that occurs with the acquisition sequence according to the invention, in particular due to the application of saturation pulses in the preparation phase, is independent of the specific design of the acquisition sequence. For example, the saturation of the tissue signals is thus independent of a special preparation time (in particular a special inversion time) and/or independent of a specific number of readout windows per readout block.

In an embodiment, the saturation pulses of the saturation pulse set occur continuously during the acquisition cycle. "Continuously" as used herein means in particular that the saturation pulses take place at regular time intervals and/or that the application of the saturation pulses during the acquisition cycle is not interrupted. This special design of the continuous saturation of the magnetization according to the invention leads to yet another improvement of the homogeneity of the saturation of the tissue signals in the magnetic resonance images acquired by the acquisition sequence.

In another embodiment, the number of saturation pulses of the saturation pulse set which take place in the preparation phase is identical to the difference between the number of all saturation pulses of the saturation pulse set and the number of all preparation pulses of the preparation pulse sequence. Accordingly, in the acquisition cycle more saturation pulses occur than preparation pulses, wherein the additional saturation pulses occur in the preparation phase of the acquisition cycle. In particular, the number of preparation pulses of the preparation pulse sequence is equal to the number of readout blocks of the readout block set. Furthermore, in the readout phase a saturation pulse can then occur immediately before each readout block, wherein a number of saturation pulses take place in addition to these saturation pulses in the preparation phase. These additional saturation pulses in the preparation phase then advantageously lead to an improved and/or more homogeneous suppression of tissue signals in the magnetic resonance images acquired by means of the acquisition sequence.

In another embodiment, the number of preparation pulses of the preparation pulse sequence which take place in the preparation phase is equal to the number of saturation pulses of the saturation pulse set that occur in the preparation phase. In the preparation phase, exactly one saturation pulse thus advantageously belongs to each preparation pulse, which ensures homogeneous saturation of tissue signals.

In another embodiment, in the preparation phase, a saturation pulse of the saturation pulse set follows immediately after each preparation pulse of the preparation pulse set. In this context, "immediately" means that no additional radio-frequency pulse takes place between the preparation pulse and the saturation pulse. A saturation of the magnetization of specific tissue types therefore takes place immediately after the preparation of the magnetization. Together with the saturation pulses in the readout phase, an improved saturation of the tissue signals thus results in the magnetic resonance images acquired by the acquisition sequence.

The magnetic resonance apparatus according to the invention has a control device that is designed to execute the method according to the invention. With the control device, the magnetic resonance apparatus can thus implement the method for magnetic resonance imaging of an examination subject using an acquisition sequence that includes at least one acquisition cycle.

For this purpose, the control device has a preparation pulse generator designed to generate a preparation pulse set with a number of preparation pulses. Furthermore, the control device has a saturation pulse generator designed to generate a saturation pulse set with a number of saturation pulses, this saturation pulse set being disjoint from the preparation pulse set. Furthermore, the control device has a readout module designed to generate a readout block set with a number of readout blocks.

The preparation pulse generator, the saturation pulse generator and the readout module are coordinated with another such that the acquisition cycle is temporally divided into a preparation phase and a readout phase, wherein the readout phase is temporally delimited from the preparation phase and the readout phase follows the preparation phase in the acquisition cycle, and wherein the preparation phase includes at least one preparation pulse of the preparation pulse set, at least one saturation pulse of the saturation pulse set and no readout block of the readout block set, and the readout phase includes at least one saturation pulse of the saturation pulse set and at least one readout block of the readout block set.

Embodiments of the magnetic resonance apparatus are designed according to the embodiments of the method according to the invention. The control device can have additional control components which are necessary and/or advantageous for execution of a method according to the invention. The control device can also be designed to send control signals to the magnetic resonance apparatus and/or to receive and/or process control signals in order to execute a method according to the invention. Computer programs and additional software by means of which a processor of the control device automatically controls and/or executes a method workflow of a method according to the invention can be stored in a memory unit of the control device. The control device can be integrated into the magnetic resonance apparatus. The control device can also be installed separately from the magnetic resonance apparatus. The control device can be connected with the magnetic resonance apparatus. The magnetic resonance images acquired by the magnetic resonance apparatus according to the invention thus advantageously have a homogeneous saturation of tissue signals, in particular across all slices of the magnetic resonance images.

The data storage medium according to the invention can be loaded directly into a memory of a programmable control device of a magnetic resonance apparatus and has program code in order to execute a method by the operation control device of the magnetic resonance apparatus. The method according to the invention can be executed quickly, robustly and so as to be identically repeatable. The computer must have the requirements (for example a corresponding working memory, a corresponding graphics card or a corresponding logic unit) so that the respective method steps can be executed efficiently. Examples of electronically readable data media are a DVD, a magnetic tape or a USB stick on which is stored electronically readable control information, in particular software (see above). All embodiments according to the invention of the method described in the preceding can be implemented when this control information (software) is read from the data medium and stored in a controller and/or control device of a magnetic resonance apparatus.

The advantages of the magnetic resonance apparatus according to the invention and of the computer program product according to the invention essentially correspond to the advantages of the method according to the invention that are described above.

BRIEF DESCRIPTION OF THE DRAWINGS

FIG. 2 shows an acquisition cycle of an acquisition sequence of a first embodiment of a method according to the invention.

FIG. 3 shows an acquisition cycle of an acquisition sequence of a second embodiment of a method according to the invention.

DESCRIPTION OF THE PREFERRED EMBODIMENTS

Figure 1:
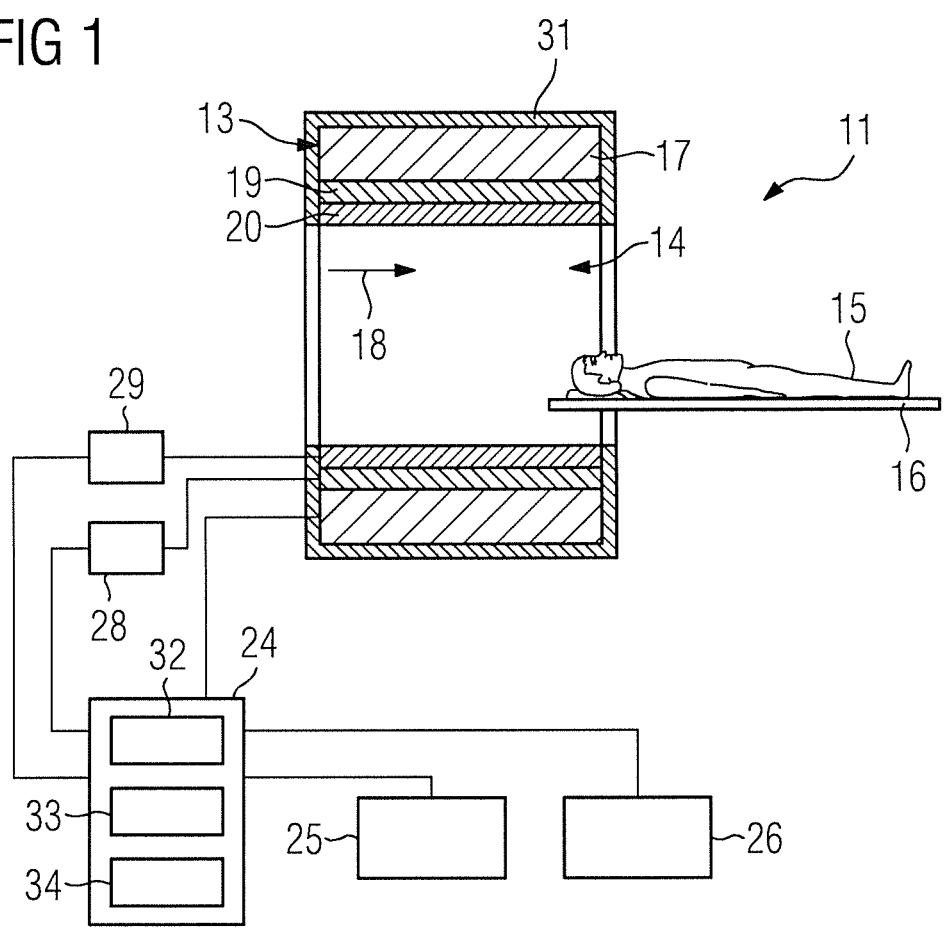
FIG. 1 schematically illustrates a magnetic resonance apparatus according to the invention for execution of a method according to the invention.

FIG. 1 schematically shows a magnetic resonance apparatus 11 according to the invention. The magnetic resonance apparatus 11 has a detector unit or scanner (formed by a magnet unit 13) with a basic field magnet 17 to generate a strong and constant basic magnetic field 18. In addition, the magnetic resonance apparatus 11 has a cylindrical patient acquisition region 14 for accommodation of a patient 15. The patient acquisition region 14 is cylindrically enclosed by the magnet unit 13 in a circumferential direction. The patient 15 can be slid into the patient acquisition region 14 by a patient support device 16 of the magnetic resonance apparatus 11. For this purpose, the patient support device 16 has a patient table that is arranged so as to be movable within the magnetic resonance apparatus 11. The magnet unit 13 is externally shielded by means of a housing casing 31 of the magnetic resonance apparatus.

Furthermore, the magnet unit 13 has a gradient coil unit 19 to generate magnetic field gradients that are used for a spatial coding during an imaging. The gradient coil unit 19 is controlled by a gradient coil unit 28. Furthermore, the magnet unit 13 has a radio-frequency antenna unit 20 (which, in the shown example, is designed so as a body coil permanently integrated into the magnetic resonance apparatus 10) and a radio-frequency antenna control unit 29 for excitation of nuclear spins in the subject by deflecting (flipping) the nuclear spins from the polarization that arises in the basic magnetic field 18 generated by the basic magnet 17. The radio-frequency antenna unit 20 is controlled by the radio-frequency antenna control unit 29 and radiates radio-frequency pulses into an examination space that is essentially formed by the patient acquisition region 14. Furthermore, the radio-frequency antenna unit 14 is designed to receive magnetic resonance signals, in particular from the patient 15.

The magnetic resonance apparatus 11 has a central control device 24 to control the basic magnet 17, the gradient coil unit 28 and the radio-frequency antenna control unit 29. The central control device 24 centrally operates the magnetic resonance apparatus 11, for example the implementation of a predetermined imaging gradient echo sequence. Control information (for example imaging parameters) and reconstructed magnetic resonance images can be displayed for a user at a display unit 25 (for example on at least one monitor) of the magnetic resonance apparatus 11. In addition, the magnetic resonance apparatus 11 has an input unit 26 by which information and/or parameters can be entered by a user during a measurement process. The control device 24 can include the gradient control unit 28 and/or radio-frequency antenna control unit 29 and/or the display unit 25 and/or the input unit 26.

The control device 24 has a preparation pulse generator 32 designed to generate a preparation pulse set with a number of preparation pulses. Furthermore, the control device has a saturation pulse generator 33 designed to generate a saturation pulse set with a number of saturation pulses, which saturation pulse set is disjoint from the preparation pulse set. Furthermore, the control device has a readout module 34 which is designed to generate a readout block set with a number of readout blocks. For this purpose, the preparation pulse generator 32, the saturation pulse generator 33 and the readout module 34 can pass control signals to the gradient control unit 28 and the radio-frequency antenna control unit 29. Together with the control device 24, the magnetic resonance apparatus 11 is thus designed to execute a method according to the invention.

The shown magnetic resonance apparatus 11 can naturally include additional components that magnetic resonance apparatuses conventionally have. The general functionality of magnetic resonance apparatuses is known to those skilled in the art, such that a detailed description of the additional components is not necessary herein.

FIG. 2 shows an acquisition cycle of an acquisition sequence of a first embodiment of a method according to the invention. The acquisition cycle serves to acquire magnetic resonance images of an examination subject 15. Shown are only the radio-frequency pulses that are executed by means of the radio-frequency antenna unit 20 and the radio-frequency antenna control unit 29 during the acquisition cycle. The radio-frequency pulses are generated by means of (among other things) the preparation pulse generator 32 and the saturation pulse generator 33 of the control device 24. The radio-frequency pulses are also plotted on a time axis as vertical lines according to their chronological sequence. Different types of radio-frequency pulses are hereby identified with different line lengths. Gradient switchings and readout windows that belong to the acquisition sequence are not shown, but naturally are also included in the acquisition sequence, suitably matched to the radio-frequency pulses.

The shown acquisition cycle of the acquisition sequence includes four preparation pulses I1, I2, I3, I4 which, in the shown case, are designed as inversion pulses I1, I2, I3, I4, for example. The inversion pulses I1, I2, I3, I4 are executed by the preparation pulse generator 32 of the magnetic resonance apparatus 11. Furthermore, the acquisition cycle includes eight saturation pulses S1, S2, S3, S4, S5, S6, S7, S8 which, in the shown case, are designed as fat saturation pulses S1, S2, S3, S4, S5, S6, S7, S8, for example. The fat saturation pulses S1, S2, S3, S4, S5, S6, S7, S8 are executed by the saturation pulse generator 33 of the magnetic resonance apparatus 11. Furthermore, the acquisition cycle includes four readout blocks B1, B2, B3, B4 which, in the shown case, are designed as turbo spin echo trains, for example. The readout blocks B1, B2, B3, B4 are executed by the readout module 34 of the magnetic resonance apparatus 11. At the beginning of the readout block B1, B2, B3, B4 a readout block B1, B2, B3, B4 thereby includes an excitation pulse X followed by eight refocusing pulses Y. A readout window (not shown) is respectively activated after each refocusing pulse Y to acquire the magnetic resonance signals.

Together with a readout block B1, B2, B3, B4, a respective inversion pulse I1, I2, I3, I4 forms the acquisition of a slice of a magnetic resonance image. The first inversion pulse I1 together with the first readout block B1 thus leads to the acquisition of the first slice of the magnetic resonance image etc. For this, the inversion pulses I1, I2, I3, I4 are designed to be slice-selective. The time which respectively elapses between an inversion pulse I1, I2, I3, I4 and the excitation pulse X of the readout block B1, B2, B3, B4 belonging to the inversion pulse I1, I2, I3, I4 is called the inversion time TI. In the shown case, the inversion time TI is inserted between the second inversion pulse I2 and the second readout block B2, for example. In the shown case eight echoes (i.e. eight k-space lines) of the respective slice are acquired during a readout block B1, B2, B3, B4. In an example of an acquisition sequence with four slices and a matrix with 256 k-space lines, the shown acquisition cycle would accordingly need to be repeated 32 times in order for all k-space lines of the matrix to be acquired.

The acquisition cycle is temporally divided into a preparation phase P and a readout phase R. In the shown acquisition cycle, the readout phase R follows the preparation phase P, wherein the fat saturation pulse S5 represents the beginning of the readout phase R since it immediately precedes the chronologically first readout block B1 of the acquisition cycle. The fifth fat saturation pulse S5 thus belongs to the readout phase R. The readout phase R is thus temporally delimited from the preparation phase P.

In the shown case, the preparation phase P includes all four inversion pulses I1, I2, I3, I4 and four fat saturation pulses S1, S2, S3, S4. The number of inversion pulses I1, I2, I3, I4 in the preparation phase P is thus equal to the number of fat saturation pulses S1, S2, S3, S4 in the preparation phase P. Furthermore, a fat saturation pulse S1, S2, S3, S4 follows immediately after each inversion pulse I1, I2, I3, I4 of the preparation phase P. No readout blocks are present in the preparation phase P. In the shown case, the readout phase R accordingly includes all four readout blocks B1, B2, B3, B4 and four fat saturation pulses S5, S6, S7, S8. A fat saturation pulse S5, S6, S7, S8 hereby immediately precedes each readout block B1, B2, B3, B4.

The fat saturation pulses S1, S2, S3, S4, S5, S6, S7, S8 are thus applied continuously over the entire acquisition cycle, in particular both in the preparation phase P and the readout phase R. In the shown case, the fat saturation pulses S1, S2, S3, S4, S5, S6, S7, S8 take place continuously during the acquisition cycle, in particular even at regular time intervals TS. The time interval TS between any two successive fat saturation pulses S1, S2, S3, S4, S5, S6, S7, S8 within the acquisition cycle is thus always the same.

A homogeneous saturation and suppression of the fat signal across all slices of the magnetic resonance image is thus achieved by an acquisition sequence with an acquisition cycle shown in FIG. 2. In particular, the fat saturation pulses S1, S2, S3, S4 which follow directly after the inversion pulses I1, I2, I3, I4 in the preparation phase P thereby decisively contribute to the homogenization of the saturation of the fat signal.

FIG. 3 shows an acquisition cycle of an acquisition sequence of a second embodiment of a method according to the invention. The acquisition cycle of this acquisition sequence differs from the acquisition cycle shown in FIG. 2 in that the preparation of the magnetization takes place interleaved with the readout of the magnetic resonance signals. An acquisition sequence with an acquisition cycle shown in FIG. 3 is thus also designated as an interleaved inversion recovery (IIR) acquisition sequence.

During the readout phase R, the fourth inversion pulse I4 thus takes place chronologically after the first readout block B1. The beginning of the readout phase R is marked by the fourth fat saturation pulse S4, which immediately chronologically precedes the first readout block B1. The number of inversion pulses I1, I2, I3, I4 and readout blocks B1, B2, B3, B4 corresponds to the number of inversion pulses I1, I2, I3, I4 and readout blocks B1, B2, B3, B4 from FIG. 2. Exclusively in the preparation phase P, a fat saturation pulse S1, S2, S3 immediately follows each inversion pulse I1, I2, I3. Since the fourth inversion pulse I4 which takes place during the readout phase R has no associated fat saturation pulse S1, S2, S3 (in contrast to the inversion pulses I2, I2, I3 of the preparation phase P), in contrast to FIG. 2 only seven fat saturation pulses S1, S2, S3, S4, S5, S6, S7 are present. The fifth fat saturation pulse S5 which follows immediately after the fourth inversion pulse I4 thereby does not belong to the fourth inversion pulse I4 but rather to the second readout block B2. The third and fourth fat saturation pulse S3 and S4 thereby immediately follow one another chronologically, since the third fat saturation pulse S3 belongs to the third inversion pulse I3 and the fourth fat saturation pulse S4 belongs to the first readout block B1.

In the acquisition cycle shown in FIG. 3 it is clarified that the number of fat saturation pulses S1, S2, S3 in the preparation phase P is equal to the difference between the total number of fat saturation pulses S1, S2, S3, S4, S5, S6, S7 and the total number of inversion pulses I1, I2, I3, I4. However, the fat saturation pulses S1, S2, S3, S4, S5, S6, S7 thereby do not take place at regular time intervals. However, this would be possible given an adaptation of the chronological progression of the acquisition cycle from FIG. 3. However, a continuous application of the fat saturation pulses S1, S2, S3, S4, S5, S6, S7 also nevertheless takes place in the acquisition cycle from FIG. 3. The application of the fat saturation pulses S1, S2, S3, S4, S5, S6, S7 is thus not interrupted in the preparation phase P, for example.

A homogeneous saturation and suppression of the fat signal across all slices of the magnetic resonance image is thus achieved by means of an acquisition sequence with an acquisition cycle shown in FIG. 3. Particularly the fat saturation pulses S1, S2, S3 which directly follow the inversion pulses I1, I2, I3 in the preparation phase P decisively contribute to the homogenization of the saturation of the fat signal. The continuous application of fat saturation pulses S1, S2, S3, S4, S5, S6, S7 over the entire acquisition cycle is especially advantageous precisely given an interleaved inversion recovery acquisition sequence, since otherwise an intensified variation of the fat signal exists across the slices of the magnetic resonance image.

The acquisition cycles of the acquisition sequences of the method according to the invention that are shown in FIG. 2 and FIG. 3 are executed by the magnetic resonance apparatus 11. For this, the magnetic resonance apparatus 11 includes the required software and/or computer programs that are stored in a memory unit of the magnetic resonance apparatus 11. The software and/or computer programs include program code that is designed to execute the method according to the invention when the computer program and/or the software is executed in the magnetic resonance apparatus 11 by means of a processor unit of the magnetic resonance apparatus 11.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising:

from a control computer, operating a magnetic resonance data acquisition unit, while an examination subject is situated in the magnetic resonance data acquisition unit, to acquire magnetic resonance data from the subject by implementing an acquisition sequence that comprises at least one acquisition cycle;

from said control computer, in said at least one acquisition cycle of said acquisition sequence, operating said magnetic resonance data acquisition unit to prepare nuclear spins in the subject with a preparation pulse set comprising a plurality of preparation pulses, and saturating a magnetization of said nuclear spins with a saturation pulse set that is disjoint from said preparation pulse set and that comprises a plurality of saturation pulses, and acquiring said magnetic resonance data in a readout block set comprising a plurality of readout blocks;

from said control computer, operating said magnetic resonance data acquisition unit in said acquisition sequence with said acquisition sequence temporally divided into a preparation phase and readout phase that is temporally delimited from said preparation phase and with said readout phase following said preparation phase in said acquisition cycle, and wherein said preparation phase comprises at least one preparation pulse of said preparation pulse set, at least one saturation phase of said saturation pulse set, and no readout block of said readout block set, and wherein said readout phase comprises at least one saturation pulse of said saturation pulse set and at least one readout block of said readout block set; and from said control computer, entering said magnetic resonance data acquired from said subject with said acquisition sequence into an electronic memory, and making the magnetic resonance data entered into the electronic memory available at an output of said control computer in electronic form as a data file.

2. A method as claimed in claim 1 comprising, from said control computer in said acquisition sequence, operating said magnetic resonance data acquisition unit with said saturation pulses of said saturation pulse set occurring continuously during said acquisition cycle.

3. A method as claimed in claim 1 comprising, from said control computer in said acquisition sequence, operating said magnetic resonance data acquisition unit with a number of said saturation pulses of said saturation pulse set that occur in said preparation phase being equal to a difference between a total number of saturation pulses in said saturation pulse set and a total number of preparation pulses of said preparation pulse set.

4. A method as claimed in claim 1 comprising, from said control computer in said acquisition sequence, operating said magnetic resonance data acquisition unit with a number of said preparation pulses of said preparation pulse set that occur in said preparation phase being equal to a number of saturation pulses of said saturation pulse set that occur in said preparation phase.

5. A method as claimed in claim 4 comprising, from said control computer in said acquisition sequence, operating said magnetic resonance data acquisition unit with a saturation pulse of said saturation pulse set in said preparation phase immediately following each preparation pulse in said preparation pulse set.

6. A magnetic resonance apparatus comprising:
a magnetic resonance data acquisition unit;
a control computer, configured to operate said magnetic resonance data acquisition unit, while an examination subject is situated in the magnetic resonance data acquisition unit, to acquire magnetic resonance data from the subject by implementing an acquisition sequence that comprises at least one acquisition cycle;
said control computer being configured, in said at least one acquisition cycle of said acquisition sequence, to operate said magnetic resonance data acquisition unit to prepare nuclear spins in the subject with a preparation pulse set comprising a plurality of preparation pulses, and saturating a magnetization of said nuclear spins with a saturation pulse set that is disjoint from said preparation pulse set and that comprises a plurality of saturation pulses, and acquiring said magnetic resonance data in a readout block set comprising a plurality of readout blocks;
said control computer being configured to operate said magnetic resonance data acquisition unit in said acquisition sequence with said acquisition sequence temporally divided into a preparation phase and readout phase that is temporally delimited from said preparation phase and with said readout phase following said preparation phase in said acquisition cycle, and wherein said preparation phase comprises at least one preparation pulse of said preparation pulse set, at least one saturation phase of said saturation pulse set, and no readout block of said readout block set, and wherein said readout phase comprises at least one saturation pulse of said saturation pulse set and at least one readout block of said readout block set;
an electronic memory; and
said control computer being configured to enter said magnetic resonance data acquired from said subject with said acquisition sequence into an electronic memory, and to make the magnetic resonance data entered into the electronic memory available at an output of said control computer in electronic form as a data file.

7. A non-transitory, computer-readable data storage medium encoded with programming instructions, said data storage medium being loaded into a control computer of a magnetic resonance apparatus, that comprises a magnetic resonance data acquisition unit, and said programming instructions causing said control computer to:
operate the magnetic resonance data acquisition unit, while an examination subject is situated in the magnetic resonance data acquisition unit, to acquire magnetic resonance data from the subject by implementing an acquisition sequence that comprises at least one acquisition cycle;
in said at least one acquisition cycle of said acquisition sequence, operate said magnetic resonance data acquisition unit to prepare nuclear spins in the subject with a preparation pulse set comprising a plurality of preparation pulses, and saturating a magnetization of said nuclear spins with a saturation pulse set that is disjoint from said preparation pulse set and that comprises a plurality of saturation pulses, and acquiring said magnetic resonance data in a readout block set comprising a plurality of readout blocks;
operate said magnetic resonance data acquisition unit in said acquisition sequence with said acquisition sequence temporally divided into a preparation phase and readout phase that is temporally delimited from said preparation phase and with said readout phase following said preparation phase in said acquisition cycle, and wherein said preparation phase comprises at least one preparation pulse of said preparation pulse set, at least one saturation phase of said saturation pulse set, and no readout block of said readout block set, and wherein said readout phase comprises at least one saturation pulse of said saturation pulse set and at least one readout block of said readout block set; and
enter said magnetic resonance data acquired from said subject with said acquisition sequence into an electronic memory, and make the magnetic resonance data entered into the electronic memory available at an output of said control computer in electronic form as a data file.

* * * * *